Oct. 10, 1967

J. PARSTORFER

MULTILAYER CIRCUIT BOARD USING EPOXY CARDS AND SILVER EPOXY CONNECTORS 3,346,689

Filed Jan. 29, 1965

4 Sheets-Sheet 1

INVENTOR.
JOHN PARSTORFER
BY
Frank D Prager
ATTORNEY

INVENTOR.
JOHN PARSTORFER
BY
Frank D. Prager
ATTORNEY

Oct. 10, 1967 J. PARSTORFER 3,346,689
MULTILAYER CIRCUIT BOARD USING EPOXY CARDS AND SILVER EPOXY CONNECTORS
Filed Jan. 29, 1965 4 Sheets-Sheet 3

INVENTOR.
JOHN PARSTORFER
BY
Frank D. Prager
ATTORNEY

INVENTOR.
JOHN PARSTORFER
BY
Frank D. Praeger
ATTORNEY

United States Patent Office 3,346,689

Patented Oct. 10, 1967

3,346,689
MULTILAYER CIRCUIT BOARD USING EPOXY CARDS AND SILVER EPOXY CONNECTORS

John Parstorfer, Philadelphia, Pa., assignor to Philco-Ford Corporation, a corporation of Delaware Filed Jan. 29, 1965, Ser. No. 428,971
2 Claims. (Cl. 174—68.5)

ABSTRACT OF THE DISCLOSURE

A cross-connected multilayer circuit board laminated of epoxy plastic cards and imprinted with circuits and check marks. The cross-connections, interconnecting selected circuit portions, are made of adhesive and conductive silver epoxy plugs, filling small, cylindrical, and closely spaced apertures which pierce the board. These apertures and the plugs therein are accurately indexed with circuit crossover points by mutually matching check marks imprinted on surfaces of the cards. Preferably the silver epoxy material of the plugs is connected to the circuits within the board through the agency of through-plated films.

*Background and summary of the invention*

Figure 1:
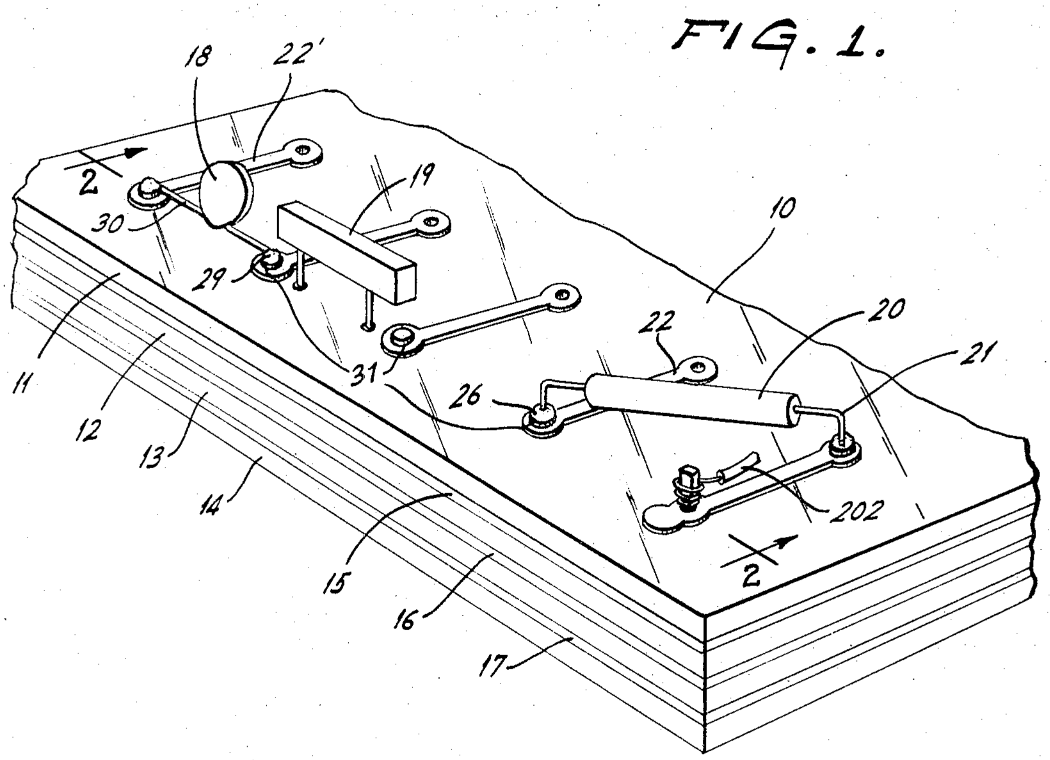

This invention relates to the construction of multilayer circuit boards and provides a new method of construction, as well as a new structure produced thereby.

Structures of this kind, as used for instance in computers or in controls of aircraft or missile systems, often have hundreds or thousands of components, with corresponding, or even larger, numbers of interconnections therebetween. In many cases it is necessary to keep some of the components or interconnections, or both, accessible for test and repair, and in such cases it is usual to arrange the components side by side, on one or both of the exposed surfaces of a flat "board". However, some or all of the interconnections can be disposed, above one another, within such board.

The invention is particularly concerned with a structure wherein components are supported on and by a board in a surface type or side-by-side arrangement, desirably with minimum spacing between the components and between their interconnections.

When all of the interconnections as well as the components are arranged side-by-side on a surface of a board, there often results need for excessive circuit board area, tending to create difficulties in the construction of the computer or other unit to be controlled. In addition it then becomes difficult to achieve the desired rapid fabrication of the circuit structure, as usually only one person, or one automatic fabricating station, can operate on the circuit board at any one time to insert a component or to test or remove the same. Still further, when all interconnections lie in only one or two planes they become very long, with consequent undesirable electric effects.

For these reasons many attempts have been made to promote space economy in arranging interconnections for components on a circuit board, and to develop and utilize multilayer techniques for said interconnections. However, further difficulties have been encountered in such attempts, as undertaken in the past. Some of the reasons can be described as follows.

Multilayer techniques of the desired type require the use of mutually superposed board elements, also known as cards, each having a dense pattern of printed circuit elements thereon and all being bonded together to constitute a laminated structure. While many of the printed circuit elements of even one layer must be insulated from such elements of all other layers, some of them must be interconnected across the laminated structure and this must be done at exactly predetermined points. Heretofore difficulties were encountered in producing and maintaining such interconnections. In particular, serious difficulties were traceable to the card laminating and bonding stages of the fabricating process, which often produced a multilayer structure subject to local or general delamination. In addition it was difficult during the card assembling and bonding procedures to keep exactly preformed circuit patterns of the different layers in adequately indexed positions and to provide for through connections properly contacting the desired elements, and only those, one with the other.

Therefore it is a general object of this invention to provide an improved method of fabricating multilayer boards and thereby to avoid or at least to minimize the aforementioned difficulties. It is a more specific object to provide such a process with a laminating and bonding phase overcoming the difficulties caused by mechanical, thermal and electrical stresses, heretofore encountered in the construction and use of such a board, which caused delamination and other destructive phenomena. It is a further specific object to provide such a process in such a way as to combine predetermined and closely packed conductive paths, on and in such a board, by secure interconnections between the different planes thereof in such a way that the interconnections are and remain adequate to carry required currents during a long service life of the multilayer board.

Figure 2:
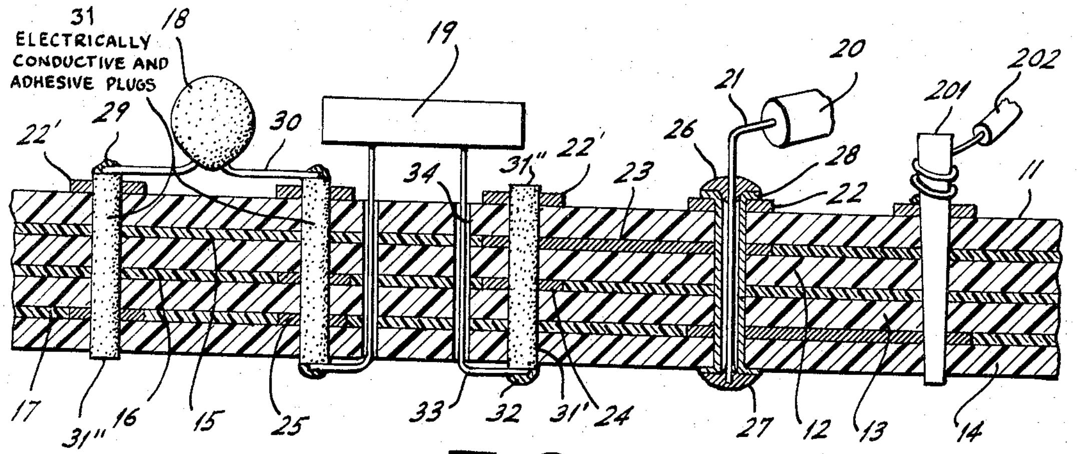

Additional problems have also been encountered in the past, and overcome by this invention. These will be described more fully hereinafter, when additional objects and advantages of the invention will become clear. The invention will best be understood from the detailed disclosure which follows, with reference to the drawing wherein:

FIGURE 1 is a perspective, fragmentary, somewhat schematic view of a multilayer circuit board unit, produced by the new method, the unit being shown on a substantially enlarged scale. FIGURE 2 is a sectional view taken along line 2—2 in FIGURE 1, with slight additional enlargement.

Figure 3:
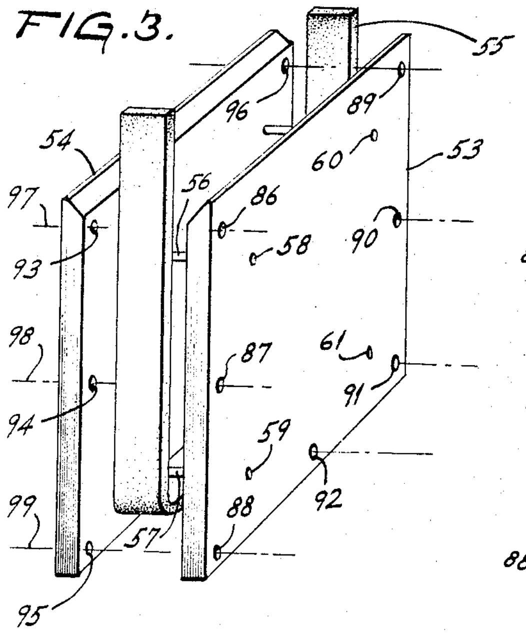
Figure 4:
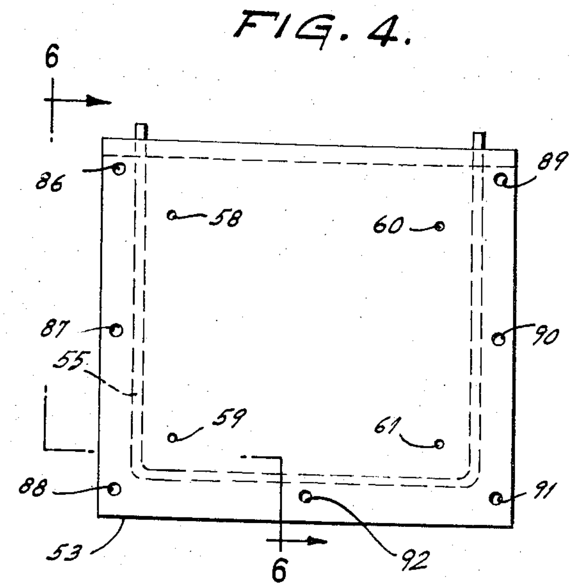
Figures 5, 5A:
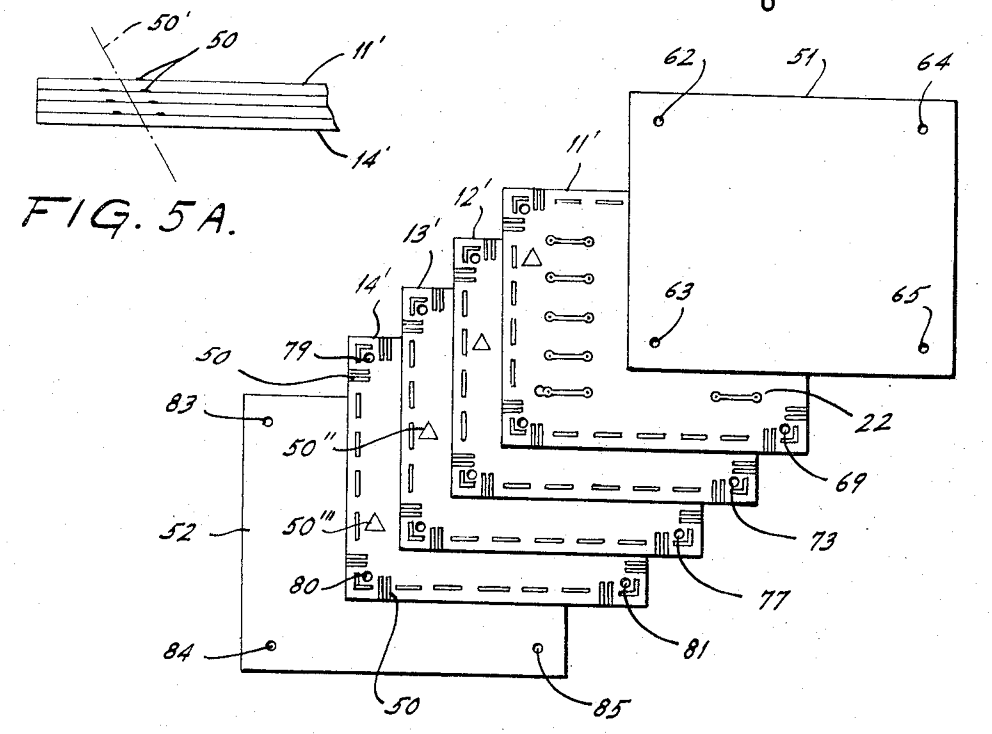

FIGURE 3 is a perspective view showing certain processing equipment used in the laminating stage of the new fabricating method. This equipment is shown on a scale substantially smaller than that of FIGURE 1, and approximately representing actual dimensions of the structures used in a typical case. FIGURE 4 is an elevational view showing this process equipment from the left side thereof, and FIGURE 5 similarly depicts a set of board elements, to be processed in the equipment of FIGURES 3 and 4, these elements being shown in partly mutually overlapping arrangement. The elements are similar to those used in FIGURES 1 and 2, but in one respect are not entirely identical therewith, as will be noted hereinafter. FIGURE 5A is a fragmentary side view of elements from FIGURE 5 in assembled condition.

Figure 6:
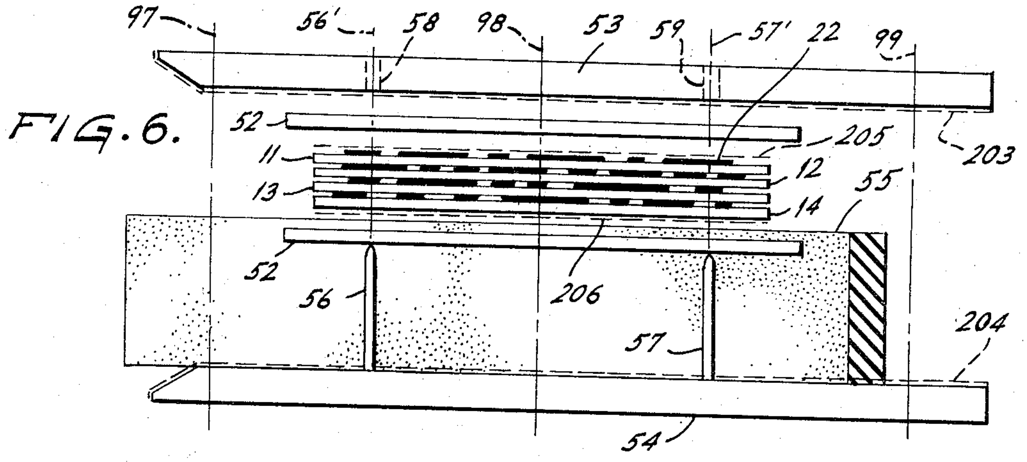
Figure 7:
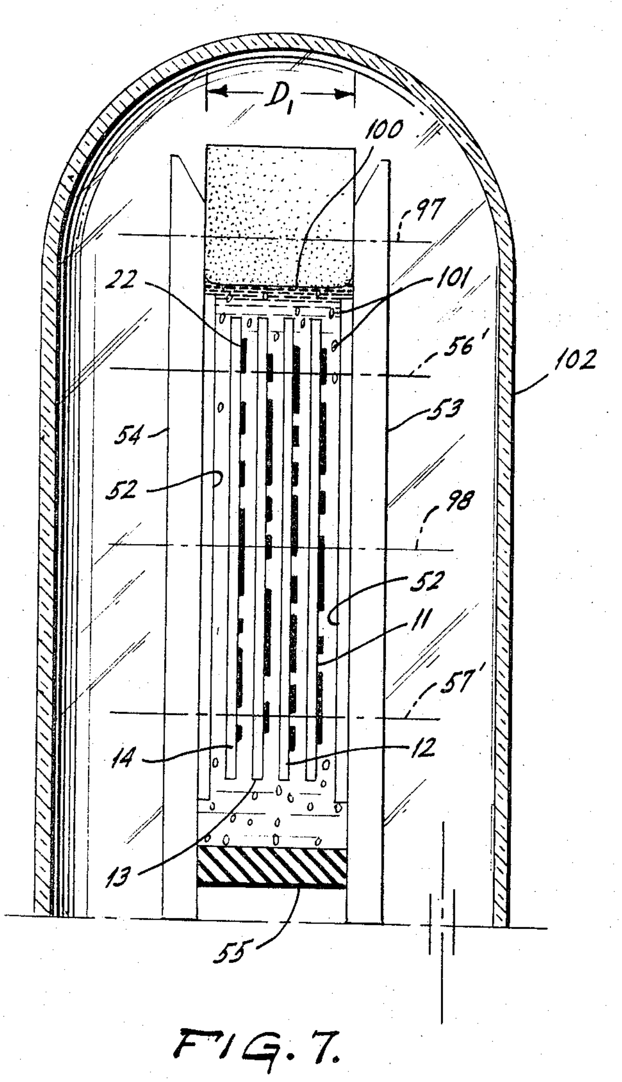
Figure 8:
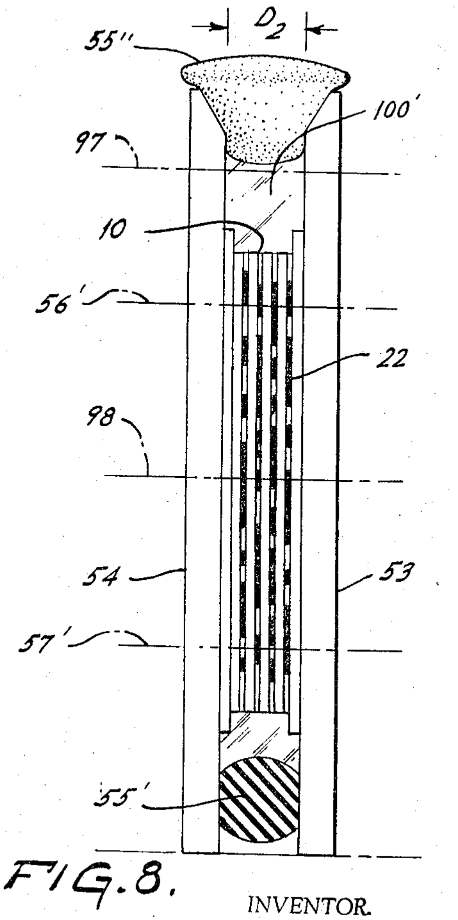

FIGURE 6 is an elevational and partly sectional view taken along a section line generally corresponding to line 6—6 in FIGURE 4, but showing the processing equipment in conjunction with board elements of the type of FIGURE 1 and on a scale between those of FIGURES 1 and 3, the equipment being shown as arranged for alignment and submersion of board elements. FIGURE 7 shows the elements of FIGURE 6 in aligned condition and in upright position for a gas removing operation. FIGURE 8 shows them in the condition maintained during a heating or curing operation.

Figure 11:
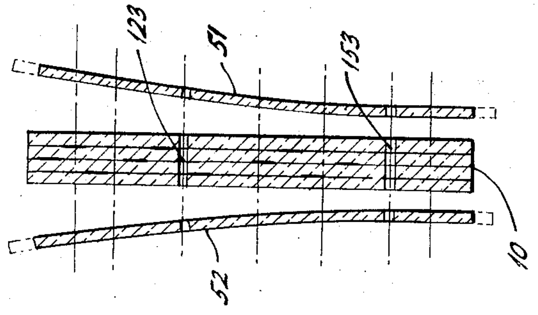
Figure 10:
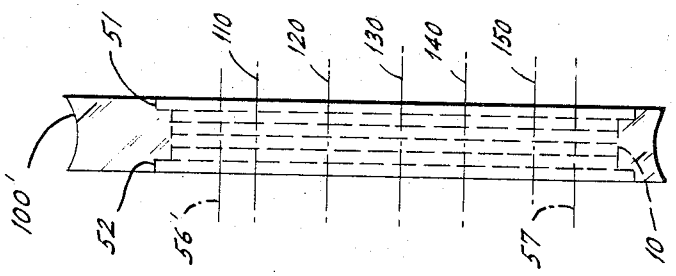
Figure 9:
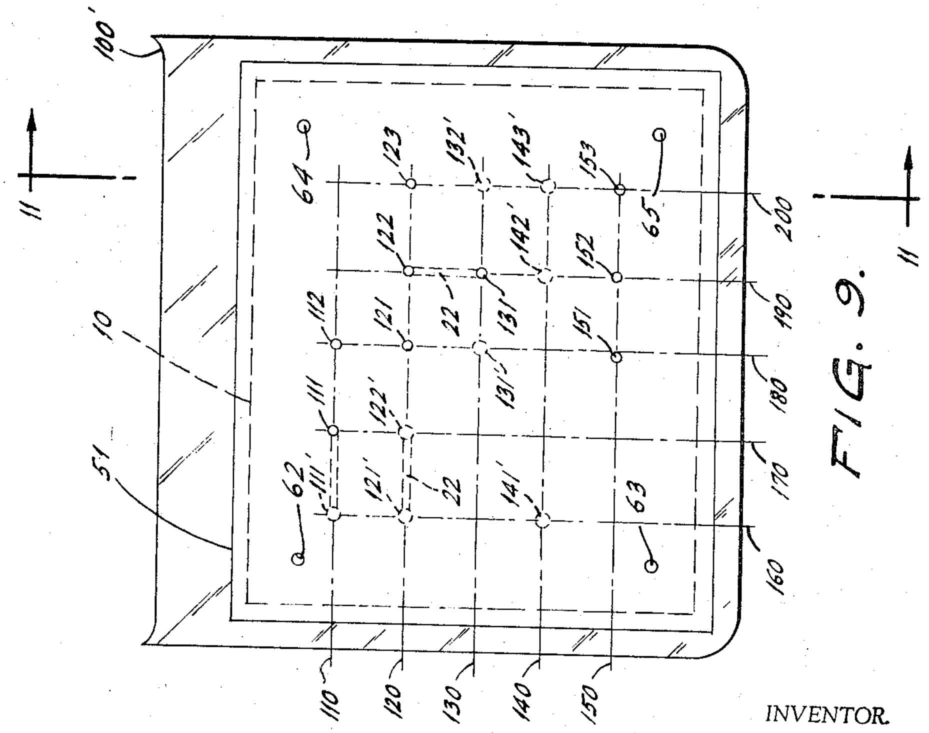

FIGURES 9 and 10 are, respectively, side and end views showing the board structure removed from the processing equipment. FIGURE 11 is a sectional view taken along line 11—11 in FIGURE 9 and showing some of the apertures formed in the structure and protective layers peeled-off therefrom. Additional reference will be made to these FIGURES 9 to 11, together with FIGURES 1 and 2, for the description of still other steps of the fabricating process.

*The new multilayer circuit board (FIGURES 1 and 2)*

FIGURE 1 shows the general appearance of the new multilayer board structure. This structure, identified by number 10, is composed of a plurality of thin board elements 11, 12, 13 and 14, also designated as cards or substrate layers. Each of them is shown as being as long and wide as the entire multilayer structure, and each is preferably made of the material generally known as glass epoxy or epoxy plastic, characterized by the use of

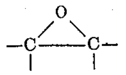

radicals. It is unnecessary to discuss the chemical composition of such epoxy compounds at this point, as the invention relates to mechanical processes and structures, not to chemistry.

The cards can, typically, have a thickness of about .008 inch, plus or minus fifty percent, although great variations are possible as to such dimensions. Thinner insulation layers 15, 16 and 17 are disposed between the several cards, in such a way as to keep the cards in mutually parallel orientation throughout the area of the board, and for instance to avoid relative tilting or bending even in the event that printed circuit elements are distributed non-uniformly over surfaces of the cards. The plastic insulation layers are desirably formed of thin adhesive films of further epoxy plastic material, applied in liquid condition and subsequently solidified, as will be described more fully hereinafter; however, it is also possible to apply solid cards or board elements, for instance 13, as insulative spacers and mechanical reenforcements.

The uppermost surface or plane of the board has electrical components suitably inserted thereon and disposed side by side, either in more or less regular rows or patterns, or in random arrangement, as is required by each circuit. The details of such arrangement and of the individual components will not be described in detail, the invention being concerned with the construction of multilayer circuit structures rather than the exact electric circuitry of any one or more circuit structures. FIGURE 1 shows a single row of components 18, 19, 20 but of course it will be understood that several rows, and substantially larger numbers of components, often are presented. These components are the most obvious feature of the entire board structure directly visible to the general observer. Also visible are portions of lead wires 21 of such components, these wires being connected to printed circuit elements 22; some of these elements, specifically shown as metal strips adherent to a board surface, are shown on top of uppermost board element 11.

In addition to these elements the sectional view of FIGURE 2 shows additional circuit lines or elements 23, 24, 25 disposed respectively between the first and second, the second and third, and the third and fourth of the illustrated cards, below the uppermost card. Insulation 15, 16, 17 fills all spaces between these lower circuit elements 23 etc. as well as the space between any two metallic circuit elements facing one another, this insulation being arranged as a film of suitable thickness so as to keep the vertical spacing of mutually overlying board surfaces uniform and to keep the several cards parallel to one another.

Some of the components, as indicated at 20, can have lead wires 21 conventionally anchored to the new board by a pair of solder spots 26, 27 disposed on opposite sides of the multilayer structure and connecting the wire to opposite ends of a conductive sleeve 28.

By contrast, and in accordance with a feature of the invention, another component 18 is shown as connected, by solder spots 29 at the end of lead wires 30, to special transverse connectors 31. These are formed of electrically conductive material, adhesive to the board elements and to underlying circuit lines 24, 25, as well as to printed circuitry 22 on the surface of upper board 11.

Connectors of this type, with solder spots 32 connecting them to still other circuit lines and wires, are also shown for instance as connected to leads 33 of a further component 19, each of the latter leads extending through the multilayer board in an aperture 34, and then along the board to the transverse connector. This latter construction is preferred, for reasons to be explained hereinafter.

*The assembling and molding of the multilayer board (FIGURES 3 to 8)*

The process of making a multilayer board in accordance with the invention begins with certain laminating and molding operations, suggested by FIGURES 3 to 5. Individual board elements 11′, 12′, 13′, 14′ are provided with printed circuit elements 22 thereon, as described above. These boards 11′ etc. are also shown as having key or check marks 50 on edge portions thereof, these marks being positioned so as to provide convenient indication of proper assembly of the multilayer board, as is explained hereinafter.

Boards 11′, 12′, etc. are mutually superposed, in suitable mutual orientation, and are then preferably held between outermost, temporarily attached sheets 51, 52, adhesively fastened to outer surfaces of boards 11′ and 14′ respectively. These outer sheets are peeled off at a later stage, as will be described hereinafter. The complete set of sheet and board elements 51, 11′, 12′, 13′, 14′, 52 is then held between outermost plates 53, 54, which are combined into a mold, frame or rack with the aid of intermediate compressible strip element 55.

The process of assembling these several elements, and a first phase of the process of laminating the multilayer board, can be described most clearly with reference to FIGURE 6, wherein outer and lower mold plate 54 is shown as lying in flat horizontal position, supporting compressible strip 55. This plate 54 is shown as having a plurality of pins 56, 57 rigidly secured thereto and vertically upstanding therefrom. Apertures 58 to 85 (FIGURE 5) indexed with the position of these pins, are formed in the six board elements 51, 11′, 12′, 13′, 14′, 52, and in the second outermost plate 53.

The actual laminating of a multilayer board, according to the invention, begins by covering the top surface of plate 54 with a film of epoxy plastic liquid (not shown). This material is strongly adhesive to the usual board elements of solid plastic material—and then dropping lowermost sheet 52, guided by pins 56, 57, into the film of liquid. Further liquid epoxy is added and board element 14 is similarly dropped into it, whereafter elements 13, 12, 11, 52, 53 are similarly added. Exact mutual indexing of board elements is effected and maintained by lining up the aforementioned apertures 58 to 85 on common guide pins 56 etc., thereby insuring that the numerous printed circuit elements 22 etc., present on the several layers of the circuit board, are kept in proper mutual alignment for successful subsequent formation of further apertures and interconnection of said elements, transversely through the multilayer board, as will be mentioned hereinafter. It will be understood that each circuit board is provided with the desired circuit patterns, as suggested at 22 in FIGURES 6–8, prior to assembly.

Still further apertures 86 to 92 are shown in FIGURE 4 as being provided in upper outermost board 53, while FIGURE 3 shows corresponding apertures 93 etc. in lower outermost board 54. Suitable bolts, not shown, are inserted in these apertures, holding the outermost plates together and suitably compressing other elements therebetween, as will be described presently. In FIGURES 6 to 8 the locations of these bolt holes and bolts are merely indicated by center lines 97, 98, 99, in the interest of simplicity of illustration and emphasis on other features.

The location of board-aligning pins 56, 57 etc. is indicated by center lines 56' etc.

When mold equipment and board elements have thus been stacked, they are placed in upright position, that is, in such position that the surfaces of the several plates, sheets and board elements are substantially vertical, as shown in FIGURE 7. If the epoxy liquid does not entirely cover board and sheet elements 52 etc. more of this liquid is added to fully submerge this board structure, between outer plates 53, 54. Compressible mold element or strip 55, which extends between these outermost plates in the approximate form of a U—as best shown in FIGURE 3—is confined between these plates, but is open at the top of this U. Within the top-open mold of FIGURE 7, thus provided, board elements 11, 12, 13, 14 are substantially freely suspended in the submerging liquid plastic material 100. This liquid is retained in the mold, flexible element 55 being slightly compressed between outermost plates 53, 54.

During and after these stacking and epoxy submerging operations, air bubbles 101 must usually be expected to be present within the liquid, both due to release of such bubbles from the liquid itself and due to adhesion or entrapment of air on the surfaces of the board elements. Retention of such gas bubbles in the epoxy material has been found to be very objectionable during further processing operations and throughout the actual use of the resulting product, a probable principal reason being that such bubbles in the multilayer structure form discontinuities and centers of mechanical stress when the board is subsequently subjected to mechanical vibration, thermal expansion or contraction and other incidents of normal use. Therefore it is important to eliminate such discontinuities from the product. This has been achieved by evacuating air from the open vertical mold, shown in FIGURE 7, by superimposing a vacuum bell 102 on the mold, promptly after the stacking and submerging operation, and applying a suitable partial vacuum to the interior of this bell, by vacuum pump equipment not shown, for instance for about three minutes. The air bubbles are thereby removed from within liquid body 100, and epoxy liquid is forced in between all surface portions of the board elements.

Promptly thereafter the mold is contracted by tightening the bolts, not shown, along center lines 97, 98, etc., thereby reducing the initial mold width $D_1$ to $D_2$, FIGURE 8. The compressible strip is deformed by this step, as indicated at 55', 55''. Solidification of the epoxy resin is then brought about by curing the entire mold, typically at 250 degrees Fahrenheit for about 20 minutes.

*Formations of cross-connections, etc.*
*(FIGURES 9 to 11 and 1 and 2)*

When adequately cured, the epoxy plastic in which the board structure is immersed forms a solid body as indicated at 100' in FIGURES 8 to 10. Excess portions of this solid body, as well as other elements of the initial assembly, are removed from multilayer board structure 10 as will be described hereinafter. Either before or after such removal but usually in a plurality of consecutive operations, the transverse apertures piercing the board structure are formed.

According to one way of carrying out the new method a first aperture forming operation comprises drilling all of the holes to be filled by conductive adhesive plugs 31 (FIGURE 2), such apertures being schematically shown in FIGURE 9 at 111, 112, 121, 122, etc. As indicated, these apertures are located along center lines 110 to 150 extending parallel to one pair of sides of the board, and at the intersections of such lines with additional guide lines 160 to 200 running parallel to the other pair of sides of the board, although many modifications of such arrangement of course are possible. By virtue of the exact alignment of stacked and laminated board elements, as described, all of the precisely pre-positioned printed circuit elements disposed on and below the multilayer board surface are accurately indexed, one with the others, so that suitable mutual indexing of drill spindle locations for forming the aforementioned holes 111, etc. (effected by well-known means not shown herein) causes formation of plug holes at the exact predetermined points of interconnection through the several layers, even when such layers are very densely packed with printed circuit elements.

Only a very few of the mutually overlying and underlying printed circuit elements 22 are shown in FIGURE 9, in order to avoid overcrowding of the drawing. Similarly only a very few of the drill holes, such as 111 to 153, are indicated. It will be understood that a board structure of the size shown in the drawing, and processed in the indicated way, provides room for more substantial numbers of circuit elements at interconnections, without danger of accidental misalignment. In many cases the apertures can be spaced much more closely than is indicated in FIGURE 9, or even in FIGURE 5. For instance, the use of interlaminar connections in drill holes of .031 inch diameter, at .2 or .1 inch center spacing, provides very successful results in accordance with this invention.

When excess plastic material 100' has been removed and plug holes 111 etc. have been formed, interconnections 31 are readily formed. In many cases it is preferred to initiate this operation by a "through-plating" step. Advantageously the inside surfaces of all plug holes are treated by a so-called electroless method to plate them with a film of metal 31', and particularly a film of copper. Then follows application of a mass of viscous or paste-like, electrically conductive material, adhesive to this film or to the board and circuit materials. For instance, epoxy plastic paste containing silver flakes can be wiped onto the uppermost surface of the board structure, with a squeegee, so that it enters and fills all of the prepared plug holes, forming the desired plug and connector members 31 at the predetermined locations (FIGURE 2). Thereafter, excess silver epoxy is wiped off, and the plugs are subsequently solidified by suitable plastic curing.

Further apertures are then formed, mainly for subsequent use in the insertion of lead wires 33. The ends of these wires are then bent in directions parallel with the board, and soldered 32 to ends 31'' of plugs 31, which for this purpose advantageously are plated with copper, or gold, or both.

Thus the general sequence of procedures in the new method is: stacking and laminating, degassing, curing, forming holes for connector plugs, forming connector plugs, drilling other holes, insertion and connection of components. This sequence avoids complications which are encountered when adhesive material, with or without conductive constituents, can reach locations where it is not strictly required.

It will be understood that the last mentioned step, insertion of components, in many cases comprises a plurality of sub-steps performed in different insertion stations and with the use of different component supplies.

During this last stage it often is desirable to insert rigid pins or holder members, as shown in FIGURES 1 and 2 at 201, in holes suitably formed for this purpose and not filled with conductive plugs. In the interest of firm assembly of the board structure it is particularly preferred to make the pins with square cross section, and in slightly tapered form as shown. Such a pin can also be used as a weld post, for instance for connection of ground wires 202, particularly when the end of the pin, to be heated in a welding operation, is sufficiently spaced above board 10 to avoid heat damage to that board.

*Peeling-off procedure (FIGURE 11)*

As will be seen from the foregoing description, the new method results in formation of thin layers of insulative epoxy material, initially applied in liquid condition between solid board elements of similar material and subsequently solidified to interconnect these elements. A substantially homogeneous epoxy structure is thus formed, which is very desirable for the construction of a multilayer board. However, it is neither necessary nor desirable to let adhesive epoxy material bond the laminated panel to the mold plates 53, 54, FIGURE 8. Various attempts have been made to overcome such bonding of the multilayer panel to the mold, for instance by treating the mold plates initially with a mold release powder or the like. This still leaves a film of epoxy material on the outside surfaces of the laminated panel, covering printed circuit elements 22, 22′ etc., FIGURE 1, thus necessitating removal of this film prior to the application of required solder spots 29. Such a film also interferes with the proper through plating and forming of conductive plugs 31. It has therefore been necessary to sand the epoxy down to the conductive network; this however has introduced further difficulty since the metal of this network is very thin. Also, the epoxy usually is more resistant to abrasion than is the copper of the printed circuit material. Nor have these difficulties been overcome by initially applying mold release materials to outermost board surfaces; it was still necessary for the epoxy to be flaked off from the panel as well as from the mold.

Greatly improved results have been achieved by the use of the aforementioned peel-off layers or glass epoxy sheets 51, 52, which are incorporated in the board structure only for and during a fabricating process and for ready and clean removal of epoxy films from the ultimate product.

Initially, as indicated by broken lines in FIGURE 6, inner surfaces of mold plates 53, 54 are treated by application of layers 203, 204 of mold release material, and similar material 205, 206 is applied to outer surfaces of peel-off sheets 51, 52. Next follows the first liquid application and submerging step attaching peel-off layer 52 to plate 54, then the other liquid applications, stacking, and ensuing operations, as described above. By means of this procedure a multilayer board 206, 10 with clean surfaces is readily obtained.

*Check system for multilayer panels (FIGURES 5, 5A)*

Returning once more to the embodiment shown in FIGURE 5, and referring more specifically to FIGURE 5A: as noted above, extreme accuracy of mutual registration of circuit elements is needed, and of course it is vital that the different cards of a board be assembled in the proper mutual relationship and sequence. Check marks 50, as provided in accordance with the invention, aid in achieving these objects.

As shown in FIGURE 5, each card carries check marks 50 offset against the former, in regular intervals, so that the edge of the properly assembled board, when suitably prepared or machined, instantly shows a comprehensive pattern of such marks, virtually following a suitably inclined center line 50′. By contrast, it will be understood that the apertures provided in the board normally extend along center lines 110 etc. (FIGURE 10) at right angles to the board surface.

The indicated positioning of check marks 50 on the various cards is readily obtained, for instance by photographic and etching techniques which are also used to form the circuit elements. The same techniques can also be used to provide suitably formed and placed symbols 50″, 50‴ on the card surfaces, which can be seen from the top surface of the board when the cards consist of more or less transparent glass epoxy plastic material, as is preferred. By this further expedient the new multilayer board also indicates, at a glance, that the required number of cards is present therein.

While only a single embodiment of the invention has been fully described, the details thereof are not to be construed as limitative of the invention. The invention contemplates such variations and modifications as come within the scope of the appended claims.

I claim:

1. A multilayer circuit board comprising a plurality of flat, electrically insulative cards, laminated and bonded together and having:

(a) a dense pattern of metallic electrical conductors printed on a plurality of said cards to provide circuit systems in several layers of said board, said systems including mutually superposed crossover points whereat conductors of different layers overlie one another and are aligned with one another in superposed relation;

(b) numerous small, substantially cylindrical apertures piercing the cards and conductors at locations distributed over the board, each disposed at one of the aligned crossover points and individual to the same;

(c) conductive metallic films plated out on the walls of said apertures; and (d) plugs of electrically conductive material mechanically adhesive to said films on said insulative cards and said metallic conductors and filling said apertures.

2. A board as described in claim 1, additionally including check indicia on the card surfaces indicating actual alignment of said crossover points in superposed relation.

References Cited

UNITED STATES PATENTS

| | | | |
|---|---|---|---|
| 2,907,925 | 10/1959 | Parsons | 174—68.5 X |
| 3,077,511 | 2/1963 | Bohrer et al. | 174—68.5 |
| 3,102,213 | 8/1963 | Bedson et al. | 174—68.5 |
| 3,202,755 | 8/1965 | Oswald | 174—68.5 |
| 3,235,942 | 2/1966 | Howell et al. | 174—68.5 X |
| 3,264,402 | 8/1966 | Shaheen et al. | 174—68.5 |
| 3,272,909 | 9/1966 | Bruck et al. | 174—68.5 |

FOREIGN PATENTS 724,379 2/1955 Great Britain.

OTHER REFERENCES

Green: "Printed Circuit Packaging," Publ. in IBM Technical Disclosure Bulletin, vol. 3, No. 12, May 1961, p. 5.

Schuchardt: German application No. 141,352, published December 1962.

DARRELL L. CLAY, *Primary Examiner.*